(12) United States Patent
Tsai et al.

(10) Patent No.: US 10,600,708 B2
(45) Date of Patent: Mar. 24, 2020

(54) ELECTRONIC PACKAGE AND METHOD FOR FABRICATING THE SAME

(71) Applicant: Siliconware Precision Industries Co., Ltd., Taichung (TW)

(72) Inventors: Wen-Shan Tsai, Taichung (TW); Chee-Key Chung, Taichung (TW); Chang-Fu Lin, Taichung (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 0 days.

(21) Appl. No.: 16/170,904

(22) Filed: Oct. 25, 2018

(65) Prior Publication Data
US 2019/0164861 A1    May 30, 2019

(30) Foreign Application Priority Data

Nov. 29, 2017 (TW) ............................. 106141602 A

(51) Int. Cl.
*H01L 23/495* (2006.01)
*H01L 23/31* (2006.01)
(Continued)

(52) U.S. Cl.
CPC .......... *H01L 23/3135* (2013.01); *H01L 21/56* (2013.01); *H01L 23/3128* (2013.01); *H01L 24/16* (2013.01); *H01L 24/17* (2013.01); H01L 24/13 (2013.01); H01L 24/48 (2013.01); H01L 24/73 (2013.01); H01L 24/92 (2013.01); H01L 2224/0401 (2013.01); H01L 2224/04042 (2013.01); H01L 2224/131 (2013.01); H01L 2224/13009 (2013.01); H01L 2224/13025 (2013.01); H01L 2224/16146 (2013.01); H01L 2224/16148 (2013.01); H01L 2224/16225 (2013.01); H01L 2224/16227 (2013.01); H01L 2224/16245 (2013.01); H01L 2224/16268 (2013.01); H01L 2224/17181 (2013.01); H01L 2224/32145 (2013.01); H01L 2224/32225 (2013.01); H01L 2224/32245 (2013.01); H01L 2224/48091 (2013.01); H01L 2224/48227 (2013.01); H01L 2224/48247 (2013.01); H01L 2224/73104 (2013.01);
(Continued)

(58) Field of Classification Search
CPC . H01L 21/56; H01L 23/3128; H01L 23/3135; H01L 24/16; H01L 24/17
USPC ........................................................ 257/668
See application file for complete search history.

(56) References Cited

U.S. PATENT DOCUMENTS 8,258,007 B2 * 9/2012 Shen ................. H01L 21/76898
257/621
8,313,982 B2 * 11/2012 Dunne .................. H01L 21/563
257/621
(Continued)

*Primary Examiner* — Luan C Thai
(74) *Attorney, Agent, or Firm* — Mintz Levin Cohn Ferris Glovsky and Popeo, P.C.; Peter F. Corless; Steven M. Jensen

(57) ABSTRACT

An electronic package and a method for fabricating the same are provided. The method includes disposing on a carrier an electronic component having a plurality of conductors, encapsulating the electronic component with an encapsulant, and disposing an electronic device on the encapsulant. The electronic device and the carrier are electrically connected through the conductors, thereby reducing the overall thickness of the electronic package.

8 Claims, 4 Drawing Sheets

(51) Int. Cl.
 *H01L 23/00* (2006.01)
 *H01L 21/56* (2006.01)
(52) U.S. Cl.
 CPC ........... *H01L 2224/73204* (2013.01); *H01L 2224/73207* (2013.01); *H01L 2224/73265* (2013.01); *H01L 2224/92125* (2013.01); *H01L 2225/06517* (2013.01); *H01L 2924/15311* (2013.01); *H01L 2924/19041* (2013.01); *H01L 2924/19042* (2013.01); *H01L 2924/19043* (2013.01); *H01L 2924/19103* (2013.01); *H01L 2924/19107* (2013.01); *H01L 2924/3511* (2013.01)

(56) References Cited

U.S. PATENT DOCUMENTS 8,446,000 B2 * 5/2013 Shen ............... H01L 21/561
 257/621
8,604,615 B2 * 12/2013 Lee ............... H01L 23/3135
 257/685
9,461,029 B2 * 10/2016 Jang ............... H01L 25/50
9,515,057 B2 * 12/2016 Ma ............... H01L 25/105

\* cited by examiner

ELECTRONIC PACKAGE AND METHOD FOR FABRICATING THE SAME

CROSS-REFERENCE TO RELATED APPLICATION

This Application claims under 35 U.S.C. § 119(a) the benefit of Taiwanese Patent Application No. 106141602 filed on Nov. 29, 2017. The entire contents of these applications are incorporated herein by reference in their entirety.

BACKGROUND

1. Technical Field

The present disclosure relates to electronic packages and methods for fabricating the same, and, more particularly, to a package stack structure and a method for fabricating the same.

2. Description of Related Art

Along with the progress of semiconductor packaging technologies, various package types have been developed for semiconductor devices. To improve electrical performance and save space, a plurality of packages can be stacked to form a package on package (PoP) structure. Such a packaging method allows merging of heterogeneous technologies in a system-in-package (SiP) so as to systematically integrate a plurality of electronic components having different functions, such as a memory, a central processing unit (CPU), a graphics processing unit (GPU), an image application processor and so on, and therefore is applicable to various thin type electronic products.

FIG. 1 is a schematic cross-sectional view of a conventional package stack structure 1. The package stack structure 1 has a lower packaging substrate 10, a semiconductor element 11 disposed in a flip-chip manner on the lower packaging substrate 10, an upper packaging substrate 12 bonded to and electrically coupled to the lower packaging substrate 10 through a plurality of supporting solder balls 13, at least an electronic device 16 such as a memory chip or a memory package structure disposed in a flip-chip manner on the upper packaging substrate 12, and an encapsulant 14 encapsulating the supporting solder balls 13 and the semiconductor element 11. Optionally, an underfill 19 is formed between the semiconductor element 11 and the lower packaging substrate 10.

The upper packaging substrate 12 is an organic packaging substrate, which can have a core layer 120 or be a coreless packaging substrate. Since the upper packaging substrate 12 generally has a thickness d of about 150 to 800 um, it becomes difficult to reduce the overall thickness D of the package stack structure 1 so as to meet the miniaturization requirement of electronic products.

Further, even if the upper packaging substrate 12 has a small thickness d, the height R of the supporting solder balls 13 must be greater than the height r of the semiconductor element 11 so as to prevent the semiconductor element 11 from impacting the upper packaging substrate 12 and causing damage. Therefore, limited by the height R of the supporting solder balls 13, the overall thickness D of the package stack structure 1 cannot be reduced to be less than 240 um.

Therefore, how to overcome the above-described drawbacks has become critical.

SUMMARY

In view of the above-described drawbacks, the present disclosure provides an electronic package, which comprises: a carrier; an electronic component disposed on the carrier, wherein the electronic component has a first side bonded to the carrier and a second side opposite to the first side; a plurality of conductors formed in the electronic component, communicating the first and second sides of the electronic component, and electrically connected to the carrier; an encapsulant formed on the carrier to encapsulate the electronic component; and an electronic device disposed on the encapsulant and electrically connected to the conductors, wherein the conductors are partially exposed from the encapsulant.

The present disclosure further provides a method for fabricating an electronic package, which comprises: disposing on a carrier at least an electronic component that has a first side bonded to the carrier and a second side opposite to the first side, wherein a plurality of conductors are formed in the electronic component, communicate the first and second sides of the electronic component, and are electrically connected to the carrier; forming an encapsulant on the carrier to encapsulate the electronic component in a manner that the conductors are partially exposed from the encapsulant, and disposing an electronic device on the encapsulant, wherein the electronic device is electrically connected to the conductors, the conductors are partially exposed from the encapsulant.

In an embodiment, a plurality of electrode pads are formed on the first or second side of the electronic component for the electronic component to be electrically connected to the carrier.

In an embodiment, the conductors protrude from the second side of the electronic component.

In an embodiment, an insulating material is formed between the electronic device and the encapsulant. In another embodiment, the insulating material is a dielectric material, a packaging material or a non-conductive film.

According to the present disclosure, the conductors are formed in the electronic component to electrically connect the carrier and the electronic device. Compared with the prior art, the present disclosure dispenses with the conventional upper packaging substrate and the supporting solder balls. Therefore, the material cost is saved, and the fabrication process is simplified. Further, the overall thickness of the electronic package is greatly reduced to meet the miniaturization requirement of electronic products.

DETAILED DESCRIPTION OF EMBODIMENTS

The following illustrative embodiments are provided to illustrate the disclosure of the present disclosure, these and other advantages and effects can be apparent to those in the art after reading this specification.

It should be noted that all the drawings are not intended to limit the present disclosure. Various modifications and variations can be made without departing from the spirit of the present disclosure. Further, terms such as "first", "second", "on", "a" etc. are merely for illustrative purposes and should not be construed to limit the scope of the present disclosure.

FIGS. 2A to 2D are schematic cross-sectional views showing a method for fabricating an electronic package according to the present disclosure.

Figure 1:
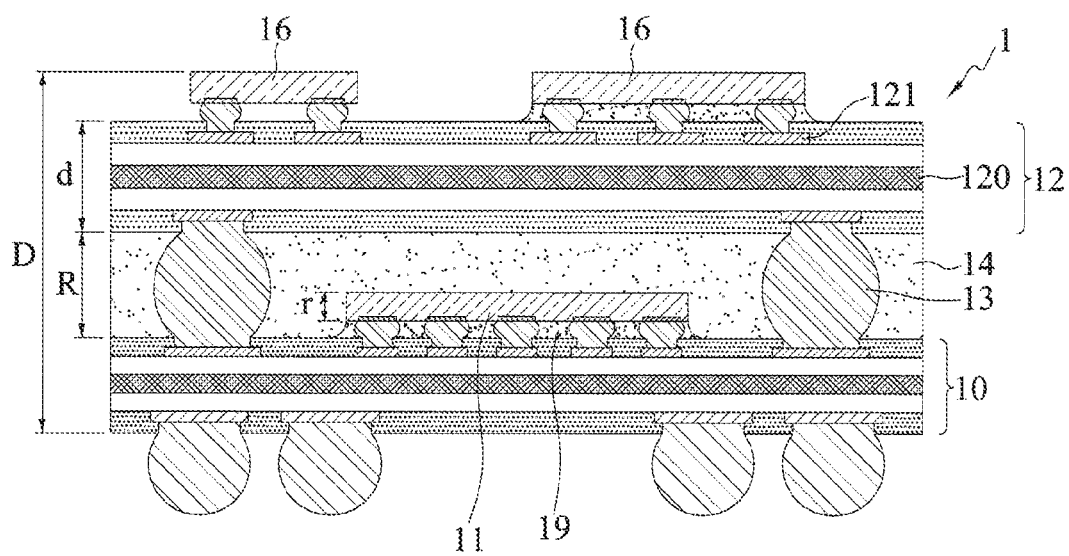
FIG. 1 is a schematic cross-sectional view of a conventional package stack structure.
Figure 2A:
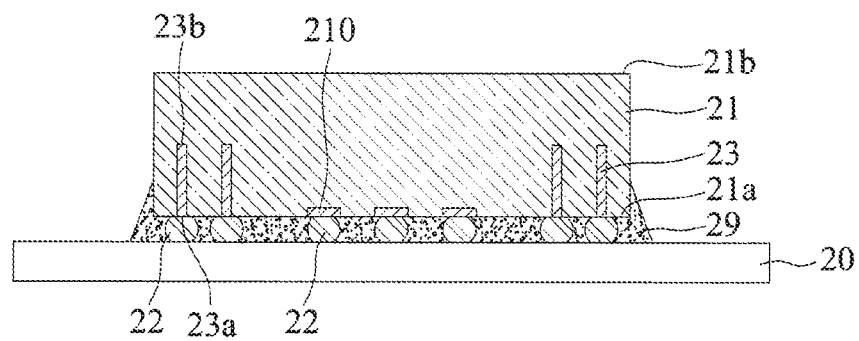
FIGS. 2A to 2D are schematic cross-sectional views showing a method for fabricating an electronic package according to the present disclosure.

Referring to FIG. 2A, at least an electronic component 21 having a plurality of conductors 23 is disposed on a carrier 20.

In an embodiment, the carrier 20 is a packaging substrate having a core layer and a circuit structure, or a coreless circuit structure, and the carrier 20 has a plurality of circuit layers such as fan-out redistribution layers. Alternatively, the carrier 20 can be, for example, a lead frame.

The electronic component 21 is an active element, such as a semiconductor chip, a passive element, such as a resistor, a capacitor or an inductor, or a combination thereof. For example, the electronic component 21 is a semiconductor chip, which has a first side 21a (i.e., an active surface) with a plurality of electrode pads 210 and a second side 21b (i.e., an inactive surface) opposite to the first side 21a. The electrode pads 210 are disposed on and electrically connected to the carrier 20 through a plurality of conductive bumps 22. The conductive bumps 22 are made of a solder material, for example. In another embodiment, referring to FIG. 4, a plurality of electrode pads 410 are disposed on a second side 21b (i.e., an active surface) of an electronic component 41 and electrically connected to the carrier 20 through a plurality of bonding wires 42.

The conductors 23 are metal posts, such as copper posts, which are formed in the electronic component 21 by a TSV (through silicon via) process. Each of the conductors 23 has a first end portion 23a and a second end portion 23b opposite to the first end portion 23a. The first end portions 23a of the conductors 23 are exposed from the first side 21a of the electronic component 21 and electrically connected to the carrier 20 through a plurality of conductive bumps 22. The conductive bumps 22 are made of such as a solder material.

Further, an underfill 29 is optionally formed between the first side 21a of the electronic component 21 and the carrier 20 to encapsulate the conductive bumps 22.

Figure 2B:
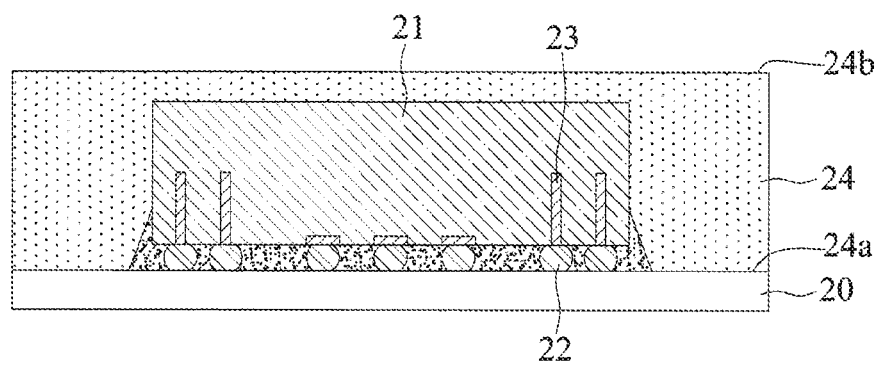

Referring to FIG. 2B, an encapsulant 24 is formed on the carrier 20 to encapsulate the electronic component 21.

In an embodiment, the encapsulant 24 is formed by lamination or molding and made of a dielectric material or a packaging material, for example, polyimide, a dry film, an epoxy resin, or a molding compound.

The encapsulant 24 has a first surface 24a bonded to the carrier 20 and a second surface 24b opposite to the first surface 24a.

Figure 3:
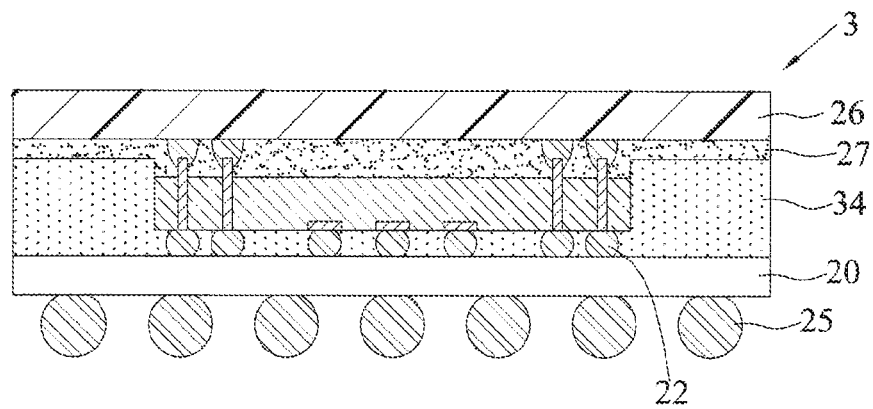
FIGS. 3 and 4 are schematic cross-sectional views showing other embodiments of FIG. 2D.

In another embodiment, referring to FIG. 3, an encapsulant 34 is optionally formed between the carrier 20 and the first side 21a of the electronic component 21 to encapsulate the conductive bumps 22.

Figure 4:
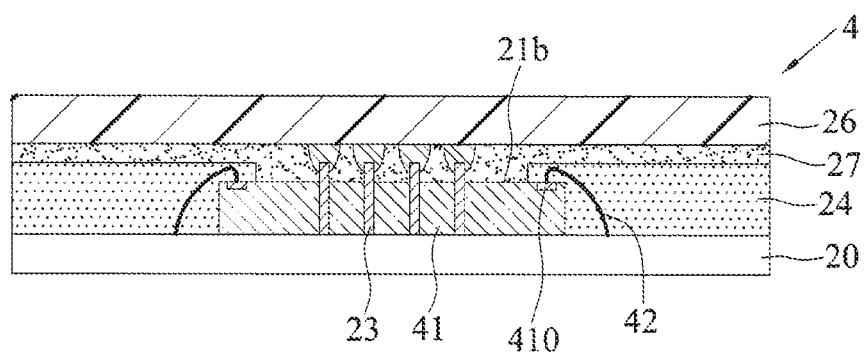

In a further embodiment, referring to FIG. 4, the encapsulant 24 encapsulates the bonding wires 42.

Figure 2C:
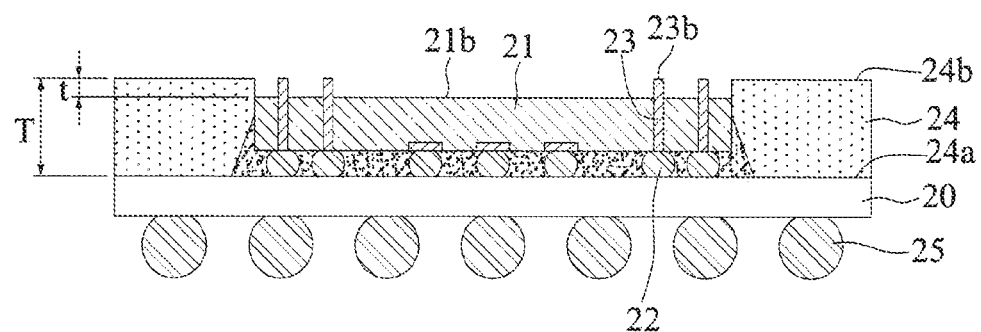

Referring to FIG. 2C, a portion of the encapsulant 24 and the electronic component 21 is removed to expose the conductors 23. The conductors 23 communicate the first side 21a and the second side 21b of the electronic component 21.

In an embodiment, the second end portion 23b of the conductors 23 protrudes from the second side 21b of the electronic component 21. In an embodiment, a leveling process is performed to remove a portion of the electronic component 21 from the second side 21b thereof so as to cause the second end portions 23b of the conductors 23 to be flush with the second side 21b of the electronic component 21. Then, an etch process is performed to remove a portion of the electronic component 21 from the second side 21b thereof and hence the second end portion 23b of the conductors 23 protrudes from the second side 21b of the electronic component 21.

In an embodiment, a portion of the encapsulant 24, the conductors 23 and the electronic component 21 is removed by grinding or cutting so as to cause the second surface 24b of the encapsulant 24, the second end portions 23b of the conductors 23 and the second side 21b of the electronic component 21 to be coplanar. As such, the thickness T of the electronic component 21 (or the encapsulant 24 or the conductors 23) is less than 100 um. Then, a dry etch process such as a plasma etch process or a reactive ion etch process is performed to remove a portion of the electronic component 21 having a thickness t of about 10 um from the second side 21b thereof. Therefore, the second end portion 23b of the conductors 23 protrudes from the second side 21b of the electronic component 21.

Further, a plurality of solder balls 25 are formed on a lower surface of the carrier 20 so as for a circuit board to be mounted thereon.

Figure 2D:
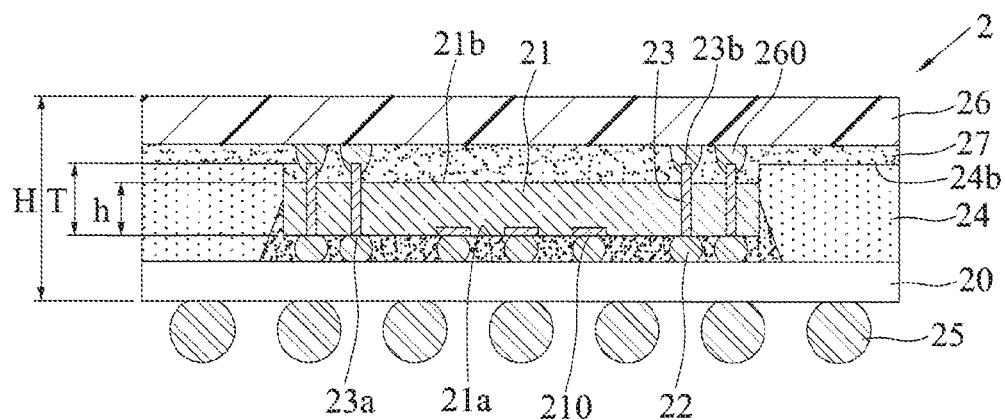

Referring to FIG. 2D, an electronic device 26 is disposed on the second surface 24b of the encapsulant 24 and electrically connected to the conductors 23 through a plurality of conductive elements 260. As such, a PoP electronic package 2 is obtained.

In an embodiment, the electronic device 26 is a high bandwidth memory (HBM) package structure, and the conductive elements 260 are conductive bumps containing a solder material.

Further, after the electronic device 26 is disposed on the second surface 24b of the encapsulant 24, an insulating material 27 is formed to encapsulate and thus protect the conductive elements 260. Also, the insulating material 27 facilitates to enhance the rigidity of the electronic package 2. The insulating material 27 is made of a dielectric material or a packaging material.

Figure 2E:
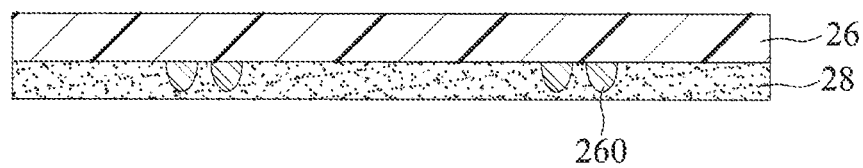
FIG. 2E is a schematic partial cross-sectional view showing another embodiment of FIG. 2D.

In another embodiment, referring to FIG. 2E, an insulating material 28 is formed on the electronic device 26 to encapsulate the conductive elements 260. Thereafter, the electronic device 26 having the insulating material 28 is disposed on the second surface 24b of the encapsulant 24 and the conductive elements 260 are bonded and electrically connected to the conductors 23. As such, the insulating material 28 protects the conductive elements 260 and enhances the rigidity of the electronic package 2. The insulating material 28 can have a flux function and can be a non-conductive film such as an anisotropic conductive paste or an anisotropic conductive film.

According to the present disclosure, the conductors 23 are disposed in the electronic component 21, 41 to electrically connect the carrier 20 and the electronic device 26. Compared with the prior art, the present disclosure dispenses with the conventional upper packaging substrate and the supporting solder balls. Therefore, the material cost is saved and the fabrication process is simplified. Since the overall thickness H of the electronic package 2, 3, 4 mainly depends on the thickness h of the electronic component 21, 41 (or the thickness T of the conductors 23), the overall thickness H of the electronic package 2, 3, 4 can be greatly reduced to be less than 240 um, thus meeting the miniaturization requirement of electronic products.

The present disclosure further provides an electronic package 2, 3, 4, which has: a carrier 20; an electronic component 21, 41 disposed on the carrier 20, wherein the electronic component 21 has a first side 21a bonded to the carrier 20 and a second side 21b opposite to the first side 21a; a plurality of conductors 23 formed in the electronic component 21, 41, communicating the first and second sides 21a, 21b of the electronic component 21, and electrically connected to the carrier 20; an encapsulant 24, 34 formed on the carrier 20 to encapsulate the electronic component 21, 41, wherein the conductors 23 are partially exposed from the encapsulant 24, 34; and an electronic device 26 disposed on the encapsulant 24, 34 and electrically connected to the conductors 23.

In an embodiment, a plurality of electrode pads 210, 410 are disposed on the first side 21a or the second side 21b of the electronic component 21, 41 and electrically connected to the carrier 20.

In an embodiment, the conductors 23 protrude from the second side 21b of the electronic component 21, 41.

In an embodiment, an insulating material 27, 28 is formed between the electronic device 26 and the encapsulant 24, 34. In an embodiment, the insulating material 27, 28 is a dielectric material, a packaging material or a non-conductive film.

According to the present disclosure, the conductors are formed in the electronic component to electrically connect the carrier and the electronic device. Compared with the prior art, the present disclosure dispenses with the conventional upper packaging substrate and the supporting solder balls, and reduces the fabrication cost and the overall thickness of the electronic package.

The above-described descriptions of the detailed embodiments are only to illustrate the implementation according to the present disclosure, and it is not to limit the scope of the present disclosure. Accordingly, all modifications and variations completed by those with ordinary skill in the art should fall within the scope of present disclosure defined by the appended claims.

What is claimed is:

1. An electronic package, comprising:
    a carrier;
    an electronic component disposed on the carrier and having a first side bonded to the carrier and a second side opposite to the first side, wherein the electronic component comprises a plurality of electrode pads disposed on the first or second side thereof for the electronic component to be connected to the carrier;
    a plurality of conductors formed in the electronic component, communicating the first and second sides of the electronic component, and electrically connected to the carrier, wherein the plurality of conductors are free from contacting the plurality of electrode pads, each of the conductors has a first end portion and a second end portion opposite the first end portion, and the first end portions of the conductors are exposed from the first side of the electronic component and electrically connected to the carrier;
    an encapsulant formed on the carrier and encapsulating the electronic component, with the second end portion of the conductors being exposed from the encapsulant; and
    an electronic device disposed on the encapsulant and electrically connected to the conductors,
    wherein when the plurality of electrode pads are formed on the first side of the electronic component, the first end portion of the conductors and the plurality of electrode pads are located in different areas of the first side of the electronic component, and when the plurality of electrode pads are formed on the second side of the electronic component, the second end portion of the conductors and the plurality of electrode pads are located in different areas of the second side of the electronic component.

2. The electronic package of claim 1, wherein the second end portion of the conductors protrude from the second side of the electronic component.

3. The electronic package of claim 1, further comprising an insulating material formed between the electronic device and the encapsulant.

4. The electronic package of claim 3, wherein the insulating material is a dielectric material, a packaging material or a non-conductive film.

5. A method for fabricating an electronic package, comprising:
    disposing on a carrier at least an electronic component having a first side bonded to the carrier and a second side opposite to the first side, wherein the electronic component comprises a plurality of electrode pads disposed on the first or second side thereof for the electronic component to be connected to the carrier, wherein a plurality of conductors are formed in the electronic component, communicate the first and second sides of the electronic component and are electrically connected to the carrier, and wherein the plurality of conductors are free from contacting the plurality of electrode pads, each of the conductors has a first end portion and a second end portion opposite the first end portion, and the first end portions of the conductors are exposed from the first side of the electronic component and electrically connected to the carrier;
    forming on the carrier an encapsulant for encapsulating the electronic component, with the second end portion of the conductors being exposed from the encapsulant; and
    disposing on the encapsulant an electronic device electrically connected to the conductors,
    wherein when the plurality of electrode pads are formed on the first side of the electronic component, the first end portion of the conductors and the plurality of electrode pads are located in different areas of the first side of the electronic component, and when the plurality of electrode pads are formed on the second side of the electronic component, the second end portion of the conductors and the plurality of electrode pads are located in different areas of the second side of the electronic component.

6. The method of claim 5, wherein the second end portion of the conductors protrude from the second side of the electronic component.

7. The method of claim 5, further comprising forming an insulating material between the electronic device and the encapsulant.

8. The method of claim 7, wherein the insulating material is a dielectric material, a packaging material or a non-conductive film.

* * * * *